(12) United States Patent  (10) Patent No.: US 8,174,023 B2
Chen                      (45) Date of Patent:     May 8, 2012

(54) METHOD OF FABRICATING MEMORY CELL

(75) Inventor: Hung-Tse Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 373 days.

(21) Appl. No.: 12/354,756

(22) Filed: Jan. 15, 2009

(65) Prior Publication Data

US 2009/0124052 A1  May 14, 2009

Related U.S. Application Data

(62) Division of application No. 11/624,695, filed on Jan. 19, 2007, now abandoned.

(30) Foreign Application Priority Data

Jul. 20, 2006 (TW) .............................. 95126500 A (51) Int. Cl.
*H01L 29/04* (2006.01)
(52) U.S. Cl. ......................................... 257/75; 257/315
(58) Field of Classification Search .................... 257/66, 257/75, 315
See application file for complete search history.

(56) References Cited

U.S. PATENT DOCUMENTS

| | | | |
|---|---|---|---|
| 5,183,498 A * | 2/1993 | Haun et al. ................. 75/709 |
| 5,783,468 A * | 7/1998 | Zhang et al. ................. 438/166 |
| 6,001,714 A * | 12/1999 | Nakajima et al. ............ 438/525 |
| 6,139,626 A * | 10/2000 | Norris et al. ................. 428/323 |
| 6,331,463 B1 * | 12/2001 | Chen ............................ 438/257 |
| 6,482,682 B2 * | 11/2002 | Sun et al. ...................... 438/149 |
| 6,518,194 B2 * | 2/2003 | Winningham et al. ....... 438/717 |
| 6,586,785 B2 * | 7/2003 | Flagan et al. ................. 257/261 |
| 6,656,568 B1 * | 12/2003 | Winningham et al. ....... 428/145 |
| 6,656,792 B2 * | 12/2003 | Choi et al. .................... 438/257 |
| 6,677,222 B1 * | 1/2004 | Mishima et al. .............. 438/488 |
| 6,812,491 B2 * | 11/2004 | Kato et al. ...................... 257/66 |
| 6,846,565 B2 * | 1/2005 | Korgel et al. ................. 428/402 |
| 6,962,850 B2 * | 11/2005 | Ho et al. ........................ 438/261 |
| 6,987,496 B2 * | 1/2006 | Koyama et al. ................ 345/76 |
| 7,022,571 B2 * | 4/2006 | Chang et al. ................... 438/257 |
| 7,033,956 B1 * | 4/2006 | Wu ................................ 438/765 |
| 7,190,877 B1 * | 3/2007 | Khang et al. ................. 385/147 |
| 7,235,443 B2 * | 6/2007 | Chang et al. ................... 438/257 |
| 7,382,017 B2 * | 6/2008 | Duan et al. ................... 257/321 |
| 7,410,889 B2 * | 8/2008 | Chen et al. .................... 438/487 |
| 2001/0021565 A1 * | 9/2001 | Chung et al. .................. 438/398 |
| 2002/0024054 A1 * | 2/2002 | Koyama et al. ................ 257/84 |
| 2002/0115272 A1 * | 8/2002 | Sun et al. ...................... 438/488 |
| 2004/0016958 A1 * | 1/2004 | Kato et al. .................... 257/316 |
| 2004/0055999 A1 * | 3/2004 | Chen et al. ...................... 216/57 |
| 2004/0219750 A1 * | 11/2004 | Chang et al. .................. 438/264 |

(Continued)

*Primary Examiner* — Bradley K Smith
(74) *Attorney, Agent, or Firm* — Jianq Chyun IP Office (57) ABSTRACT

A method of fabricating a memory cell includes following steps. First, a substrate is provided, and a control gate is formed on the substrate. Then, a dielectric layer is formed to cover the control gate and the substrate. Afterward, an α-SiGe layer is formed on the dielectric layer. After that, a laser annealing process is performed to oxidize the α-SiGe layer into a silicon oxide layer, so as to separate out Ge atoms from the α-SiGe layer to form a Ge quantum dot layer between the silicon oxide layer and the dielectric layer. A poly-Si island is then formed on the silicon oxide layer, wherein the poly-Si island includes a source doped region, a drain doped region, and a channel region located therebetween.

9 Claims, 8 Drawing Sheets

U.S. PATENT DOCUMENTS

| | | | |
|---|---|---|---|
| 2005/0072989 A1* | 4/2005 | Bawendi et al. | 257/200 |
| 2005/0095786 A1* | 5/2005 | Chang et al. | 438/260 |
| 2005/0136581 A1* | 6/2005 | Kato et al. | 438/197 |
| 2005/0164434 A1* | 7/2005 | Arakawa et al. | 438/149 |
| 2005/0226591 A1* | 10/2005 | Gardner et al. | 385/147 |
| 2005/0263767 A1* | 12/2005 | Yamazaki et al. | 257/72 |
| 2006/0051905 A1* | 3/2006 | Chen et al. | 438/149 |
| 2006/0255331 A1* | 11/2006 | Chen et al. | 257/19 |
| 2007/0141478 A1* | 6/2007 | Chen et al. | 430/5 |

* cited by examiner

METHOD OF FABRICATING MEMORY CELL

CROSS-REFERENCE TO RELATED APPLICATION

This application is a divisional of and claims priority benefit of an application Ser. No. 11/624,695, filed on Jan. 19, 2007, now pending, which claims the priority benefit of Taiwan application serial no. 95126500, filed on Jul. 20, 2006. The entirety of each of the above-mentioned patent applications is hereby incorporated by reference herein and made a part of this specification.

BACKGROUND OF THE INVENTION

1. Field of Invention

The present invention relates to a memory cell and a fabricating method thereof. More particularly, the present invention relates to a memory cell having metal-oxide-quantum dot-oxide-polysilicon fabricated on a glass substrate and a fabricating method thereof.

2. Description of Related Art

Due to the features of light-weight and compactness, the liquid crystal display (LCD) and the organic light emitting display (OLED) have gradually become display tools of the portable terminal systems in the last twenty years. In particular, the twist nematic liquid crystal display (TN-LCD), the super twist nematic liquid crystal display (STN-LCD), the thin film transistor liquid crystal display (TFT-LCD) and the organic light emitting display (OLED) have become indispensable daily used products for people. In a common TFT-LCD, a pixel thereof comprises a TFT, a storage capacitor and a pixel electrode. The image data to be written into each pixel would be stored in the storage capacitor and be updated frame by frame. Therefore, the TFT-LCD with such architecture has a high power-consumption.

For many portable electronic products today, the LCD thereof displays static images for the most of the time. Thus, it is not necessary to refresh the image data stored in a pixel all the time. Under such situation, if a memory, such as a static random access memory (SRAM) or a dynamic random access memory (DRAM), can be embedded in each pixel, the power-consumption of LCD would be largely reduced.

Figure 1:
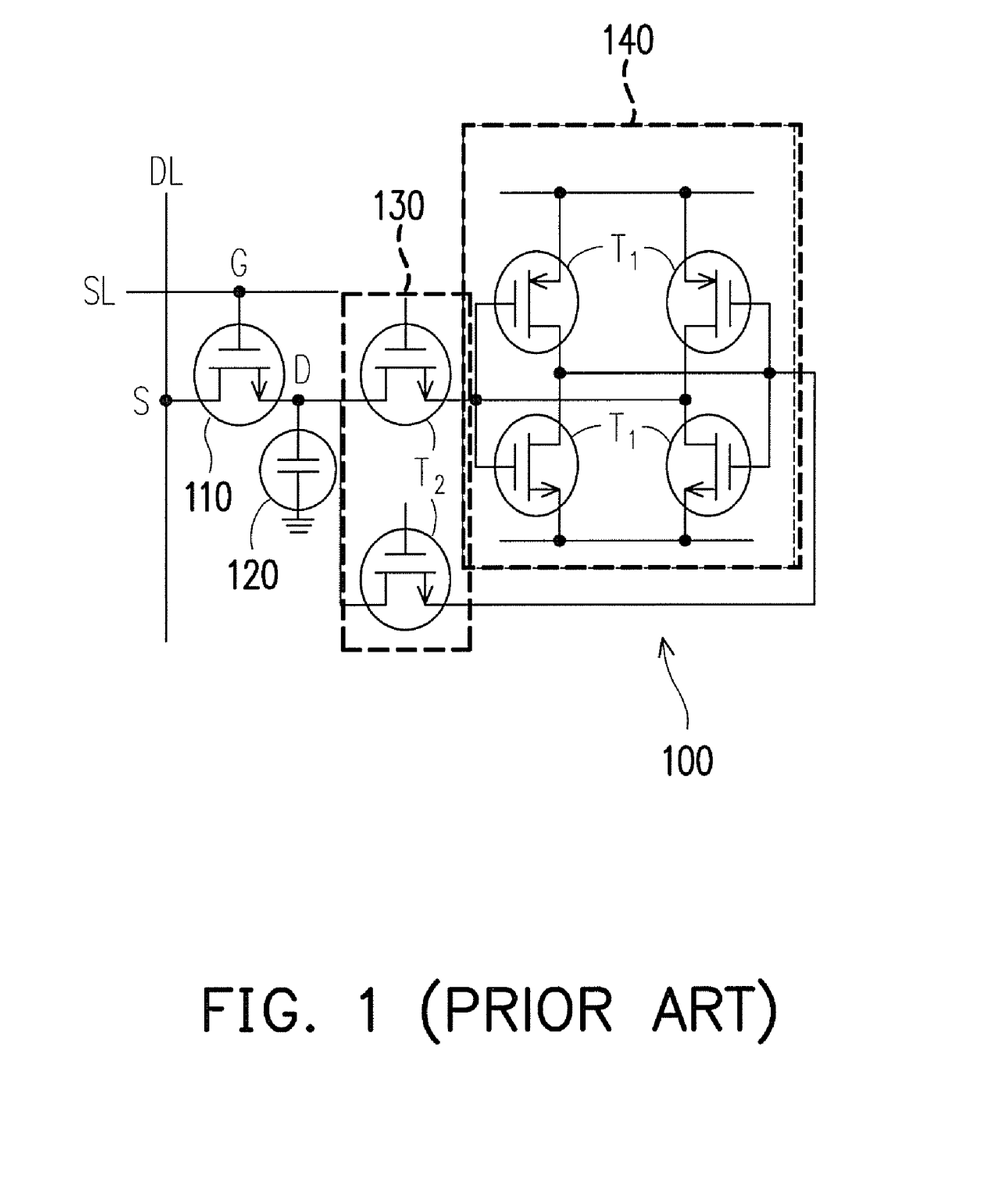
FIG. 1 is a circuit diagram of a conventional pixel structure.

FIG. 1 is a circuit diagram of a conventional pixel structure. Referring to FIG. 1, a conventional pixel structure 100 for displaying static frames includes a TFT 110, a liquid crystal capacitor 120, a memory control circuit 130 and a SRAM 140. Wherein, the gate G of the TFT 110 is electrically connected to a scan line SL, the source S of the TFT 110 is electrically connected to a data line DL and the drain D of the TFT 110 is electrically connected to a liquid crystal capacitor 120. In addition, the drain D of the TFT 110 is electrically connected to the SRAM 140 through the memory control circuit 130, so that the image signal input into the liquid crystal capacitor 120 from the data line DL can be stored in the SRAM 140 through the memory control circuit 130.

Under the condition of displaying static images, since the SRAM 140 can remain the differential voltage of the liquid crystal capacitor 120 without updating the data all the time, the power-consumption can be largely reduced. However, since a SRAM 140 comprises four TFTs T1 and a memory control circuit 130 comprises two TFTs T2, the circuit layout of the pixel structure 100 is considerably crowded. Moreover, because the TFTs T1 and T2 adversely affect the aperture ratio of the pixel structure 100, the pixel structure 100 is applicable to a reflective LCD panel, and is not suitable for a transmissive LCD panel.

Currently, Ge quantum dots having a charge storage function is proposed to replace the polysilicon floating gate or charge storage layer of the conventional memory. A rapid thermal process has been disclosed in U.S. Pat. No. 6,962,850 B2, which sustains 30 seconds under 800-1,000° C. to separate out Ge quantum dots from the Ge-doping silicon oxide layer. However, as the above method of forming Ge quantum dots must be carried out under a high temperature, which leading to the increase of the thermal budget of the process.

Furthermore, another method of forming Ge quantum dots has been disclosed in "MOS Memory Using Germanium Nanocrystals Formed by Thermal Oxidation of $Si_{1-x}Ge_x$", Electron Devices Meeting, 1998. IEDM '98 Technical Digest., International 6-9 December 1998 Page(s):115-118, in which dry oxidation process and wet oxidation process are alternately repeated several times to separate out the Ge quantum dots. However, this method is quite complicated and may cause an increase of the thermal budget of the process.

In view of the above, some related techniques are disclosed in some U.S. Patents, such as U.S. Pat. Nos. 6,139,626, 5,183,498, 6,518,194, 6,656,568, 6,846,565 B2. The entire content of the above documents is incorporated herein by reference.

SUMMARY OF THE INVENTION

Accordingly, the present invention is directed to provide a method of fabricating a memory cell, which can be integrated with a low temperature polysilicon TFT manufacturing process (LTPS-TFT manufacturing process).

The present invention is directed to provide a memory cell that can be integrated into an LTPS-TFT.

As embodied and broadly described herein, the present invention provides a method of fabricating a memory cell, which comprises the following steps. First, a poly-Si island is formed on a substrate, wherein the poly-Si island comprises a source doped region, a drain doped region, and a channel region located therebetween. Then, a first dielectric layer is formed on the poly-Si island. Afterward, an α-SiGe layer is formed on the first dielectric layer. Next, a laser annealing process is performed to oxidize the α-SiGe layer into a silicon oxide layer, so as to separate out Ge atoms from the α-SiGe layer to form a Ge quantum dot layer between the silicon oxide layer and the first dielectric layer. After that, a control gate is formed on the silicon oxide layer.

As embodied and broadly described herein, the present invention further provides a method of fabricating a memory cell, which comprises the following steps. First, a substrate is provided, and a control gate is formed on the substrate. Then, a dielectric layer is formed to cover the control gate and the substrate. Afterward, an α-SiGe layer is formed on the dielectric layer. After that, a laser annealing process is performed to oxidize the α-SiGe layer into a silicon oxide layer, so as to separate out Ge atoms from the α-SiGe layer to form a Ge quantum dot layer between the silicon oxide layer and the dielectric layer. Then, a poly-Si island is formed on the silicon oxide layer, wherein the poly-Si island comprises a source doped region, a drain doped region, and a channel region located therebetween.

The memory cell of the present invention is suitable to be disposed on a substrate and comprises a poly-Si island, a first dielectric layer, a Ge quantum dot layer, a silicon oxide layer, and a control gate. The poly-Si island is disposed on the substrate, wherein the poly-Si island comprises a source doped region, a drain doped region, and a channel region located therebetween. The first dielectric layer is disposed on the poly-Si island. The Ge quantum dot layer is disposed on the first dielectric layer, serving as a trapping layer. The silicon oxide layer is disposed on the Ge quantum dot layer. A control gate is disposed on the silicon oxide layer.

As embodied and broadly described herein, the present invention further provides a memory cell. The memory cell is suitable to be disposed on a substrate and comprises a control gate, a dielectric layer, a Ge quantum dot layer, a silicon oxide layer, and a poly-Si island. The control gate is disposed on the substrate. The dielectric layer is disposed on the control gate and located on the substrate. The Ge quantum dot layer is disposed on the dielectric layer, serving as a trapping layer. The silicon oxide layer is disposed on the Ge quantum dot layer. The poly-Si island is disposed on the silicon oxide layer, wherein the poly-Si island comprises a source doped region, a drain doped region, and a channel region located therebetween.

In order to make the aforementioned and other objectives, features and advantages of the present invention comprehensible, preferred embodiments accompanied with figures are described in detail below.

DESCRIPTION OF EMBODIMENTS

Various memory cells and fabricating methods thereof are illustrated in the following embodiments. The memory cell of the present invention has the oxide-quantum dot-oxide structure integrated into the LTPS-TFT, the methods of fabricating the memory cells illustrated in the present invention can be integrated with the LTPS-TFT manufacturing process. In other words, in the pixel structure, when the voltage applied to the control gate is insufficient to carry out "programming" or "erasing", the following memory cell structure can still be used as a TFT.

FIGS. 2A to 2F are schematic views of the processes of fabricating the memory cell according to an embodiment of the present invention.

Figure 2A:
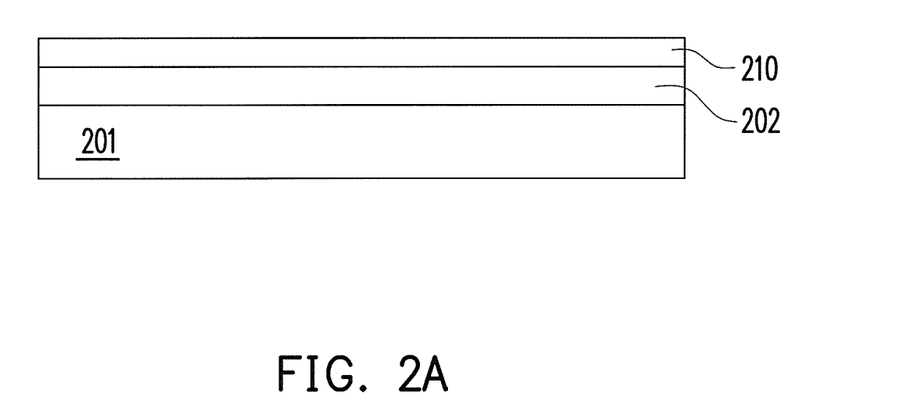
FIGS. 2A to 2F are schematic views of the processes of fabricating the memory cell according to an embodiment of the present invention.

First, referring to FIG. 2A, a substrate 201 is provided, which is, for example, a glass substrate or other transparent substrates. Then, an amorphous silicon layer 210 is formed on the substrate 201. In the present embodiment, the amorphous silicon layer 210 is, for example, formed by chemical vapor deposition (CVD). Moreover, before forming the amorphous silicon layer 210, a buffer layer 202 can be further selectively formed on the substrate 201 to block the impurities from the substrate 201. The above buffer layer 202 can be, for example, a silicon nitride thin film or other thin films capable of blocking impurities.

Figure 2B:
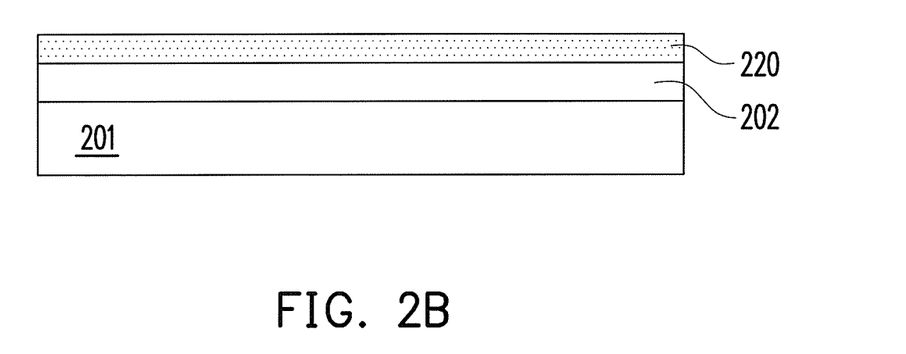

Then, referring to FIG. 2B, after the amorphous silicon layer 210 is formed, an annealing process is used to melt the amorphous silicon layer 210 on the substrate 201, and recrystallize the amorphous silicon layer 210 into a polysilicon layer 220. In the present embodiment, the annealing process is, for example, an ELA (excimer laser annealing) process.

Figure 2C:
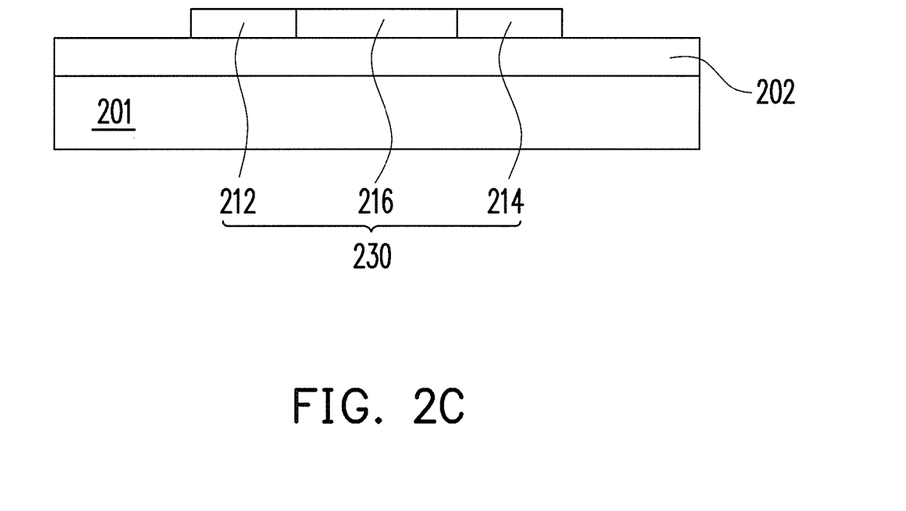

Afterward, referring to FIG. 2C, the polysilicon layer 220, after being formed, is patterned and then doped, so as to form a poly-Si island 230 having a source doped region 212, a drain doped region 214, and a channel region 216.

Figure 2D:
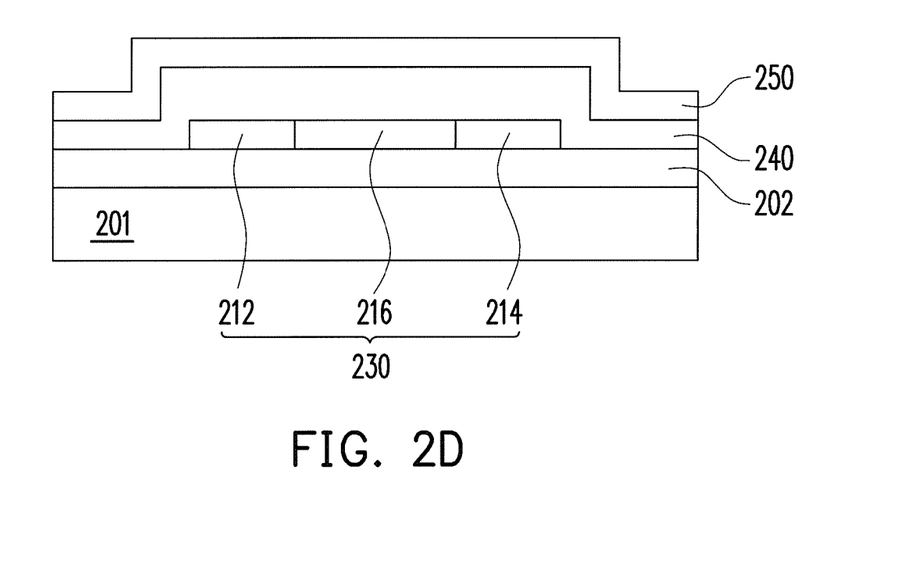

Next, referring to FIG. 2D, after the poly-Si island 230 is formed, and a dielectric layer 240 is formed on the poly-Si island 230. The dielectric layer 240 is, for example, formed by CVD and the material thereof is, for example, silicon dioxide. Then, after the dielectric layer 240 is formed, an α-SiGe layer 250 is formed on the dielectric layer 240. The α-SiGe layer 250 is, for example, formed by CVD and the thickness thereof is in a range of, for example, about 3-10 nm.

Figure 2E:
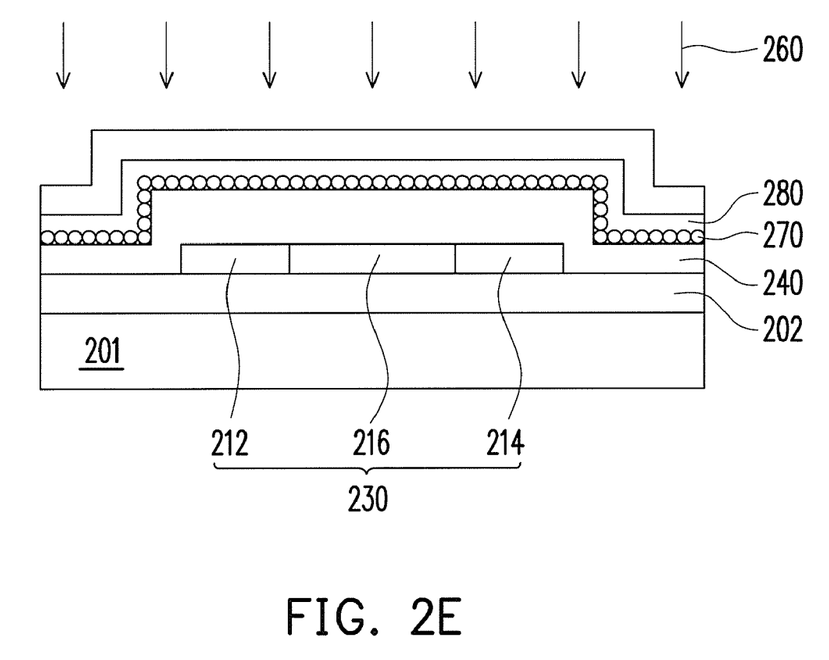

After that, referring to FIG. 2E, after the α-SiGe layer 250 is formed, a laser annealing process 260 is performed to oxidize the α-SiGe layer 250 into a silicon oxide layer 280, so as to separate out Ge atoms from the α-SiGe layer 250 to form a Ge quantum dot layer 270 between the silicon oxide layer 280 and the dielectric layer 240. The Ge quantum dot layer 270 can be a trapping layer. In the present embodiment, the laser annealing process 260 is, for example, an ELA process. More particularly, the laser annealing process 260 is performed, for example, in an atmosphere containing oxygen, wherein oxygen atoms react with Si atoms of the α-SiGe layer 250, so as to separate out Ge atoms from the α-SiGe layer 250. In addition, the material of the silicon oxide layer 280 is, for example, silicon dioxide.

It should be noted that the above technique using the laser annealing process to separate out Ge atoms from the α-SiGe layer so as to form a Ge quantum dot layer serving as a trapping layer can be performed under a low temperature, for example, room temperature. The transient temperature of the laser annealing process can reach approximately 100° C. When being transmitted to the buffer layer 202, the temperature is reduced to approximately below 100° C., so as to effectively reduce the thermal budget of the process.

Figure 2F:
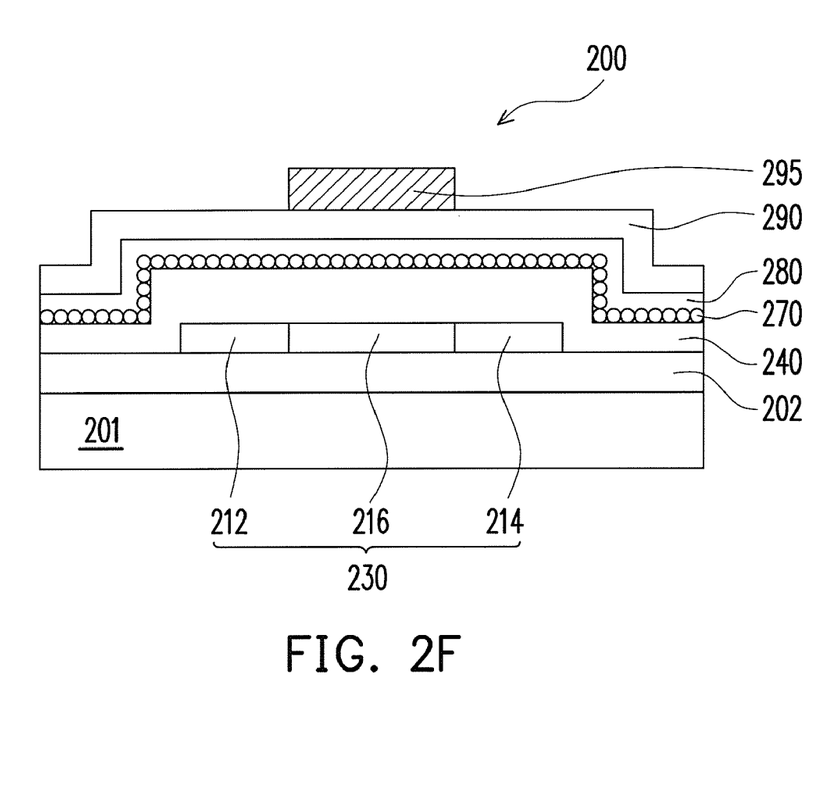

After that, referring to FIG. 2F, a control gate 295 is formed on the silicon oxide layer 280, so as to fabricate the memory cell 200 of the present embodiment. The material of the control gate 295 is, for example, doped polysilicon or other conductive materials. In an embodiment, after the silicon oxide layer 280 is formed, and before the control gate 295 is formed, a dielectric layer 290 can be further formed on the silicon oxide layer 280. The dielectric layer 290 is, for example, formed by CVD and the material thereof is, for example, silicon dioxide.

In another embodiment, after the control gate 295 is formed, the dielectric layer 240, Ge quantum dot layer (trapping layer) 270, and dielectric layer 290 are patterned, so as to expose a portion of the source doped region 212 and drain doped region 214 (not shown). Afterward, a source contact metal (not shown) and a drain contact metal (not shown) are respectively formed on the exposed source doped region 212 and drain doped region 214. In another embodiment, before the dielectric layer 240, Ge quantum dot layer (trapping layer) 270, and dielectric layer 290 are patterned, a passivation layer (not shown) is formed to cover the control gate 295.

Referring to FIG. 2F again, the memory cell 200 of the present invention is suitable to be disposed on a substrate 201, and the substrate 201 is, for example, a glass substrate or other transparent substrates. The memory cell 200 of the present embodiment includes a poly-Si island 230, a dielectric layer 240, a Ge quantum dot layer 270, a silicon oxide layer 280, and a control gate 295. The poly-Si island 230 is disposed on the substrate 201 and includes a source doped region 212, a drain doped region 214, and a channel region 216 located therebetween. The dielectric layer 240 is disposed on the poly-Si island 230. The Ge quantum dot layer 270 is disposed on the dielectric layer 240, serving as a trapping layer. The silicon oxide layer 280 is disposed on the Ge quantum dot layer 270. The control gate 295 is disposed on the silicon oxide layer 280. The components of the memory cell 200 will be illustrated in detail as follows.

In the present embodiment, the source doped region 212 and the drain doped region 214 in the poly-Si island 230 are highly-doped N-type doped regions (N+), and the channel region 216 in the poly-Si island 230 is a low-doped N-type doped region (N−).

In the present embodiment, the dielectric layer 240 can be taken as a charge tunneling layer, and the material thereof is, for example, silicon dioxide or other dielectric materials that can be tunneled through by charges. The Ge quantum dot layer 270 can serve as a trapping layer which is regarded as a charge storage layer. Moreover, in an embodiment, the memory cell 200 of the present embodiment can further includes the dielectric layer 290 disposed between the control gate 295 and the silicon oxide layer 280. In addition, the silicon oxide layer 280 and the dielectric layer 290 can be regarded as charge blocking layers, wherein the material of the silicon oxide layer 280 is, for example, silicon dioxide, and the material of the dielectric layer 290 is, for example, silicon dioxide or other dielectric materials capable of resisting the injection of charges.

Furthermore, in an embodiment, the memory cell 200 of the present embodiment further includes a buffer layer 202 disposed between the substrate 201 and the poly-Si island 230. The buffer layer 202 can prevent the impurities of the substrate 201 from dispersing into the poly-Si island 230, and the material thereof can be silicon nitride thin film or other thin films capable of blocking impurities.

Moreover, in order to enhance the device reliability of the memory cell 200, the memory cell 200 of the present embodiment further includes a passivation layer (not shown), so as to cover the poly-Si island 230, dielectric layer 240, Ge quantum dot layer 270, silicon oxide layer 280, dielectric layer 290, and control gate 295. Accordingly, the material of the passivation layer is, for example, silicon oxide, silicon nitride, or the combination thereof. Definitely, in order to successfully apply a voltage to the source doped region 212 and the drain doped region 214, the memory cell 200 of the present embodiment can further include a source contact metal (not shown) and a drain contact metal (not shown), wherein the source contact metal is electrically connected to the source doped region 212, and the drain contact metal is electrically connected to the drain doped region 214.

It should be noted that the above poly-Si island 230, dielectric layer 240, Ge quantum dot layer 270, silicon oxide layer 280, and control gate 295 constitute a workable memory cell. The buffer layer 202, passivation layer, source contact metal, and drain contact metal are all optional components. Various appropriate modifications and variations can be made by those skilled in the art with reference to the content of the present invention, and the modifications and variations still fall in the scope of the present invention.

FIGS. 3A to 3E are schematic views of the processes of fabricating the memory cell according to another embodiment of the present invention.

Figure 3A:
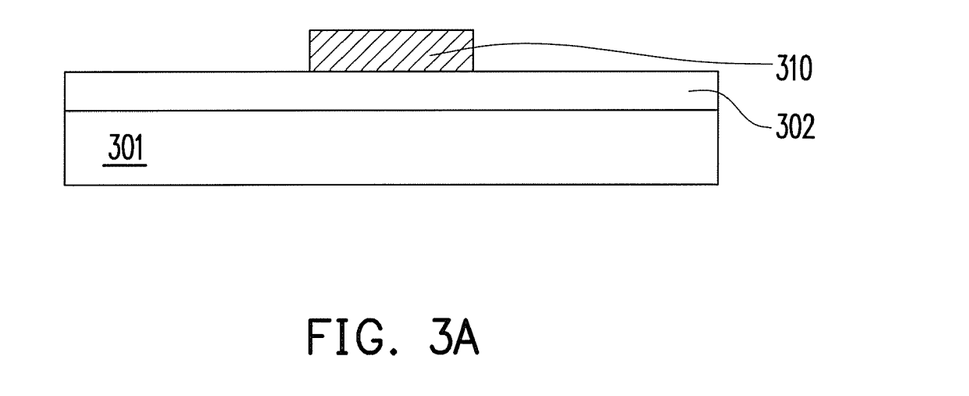
FIGS. 3A to 3E are schematic views of the processes of fabricating the memory cell according to another embodiment of the present invention.

First, referring to FIG. 3A, a substrate 301 is provided, which is, for example, a glass substrate or other transparent substrates. Then, a control gate 310 is formed on the substrate 301. The material of the control gate 310 is, for example, doped polysilicon or other conductive materials. Further, in the present embodiment, before the control gate 310 is formed, a buffer layer 302 is selectively formed on the substrate 301, so as to block the impurities from the substrate 301. The above buffer layer 302 can be, for example, a silicon nitride thin film or other thin films capable of blocking impurities.

Figure 3B:
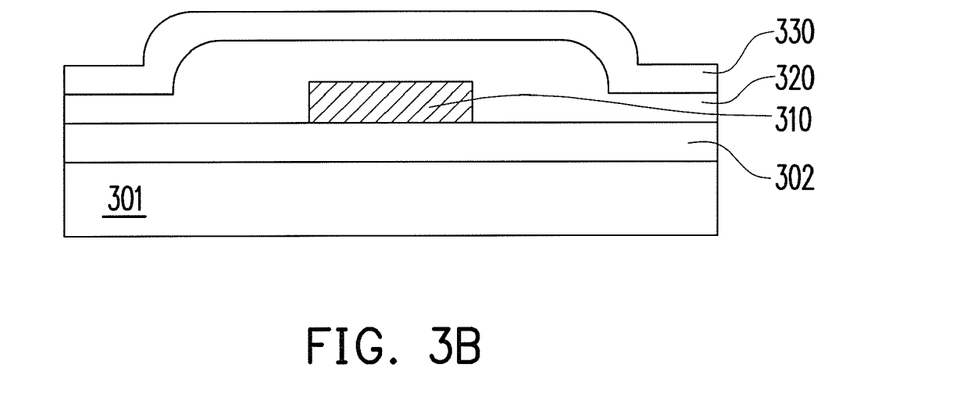

Then, referring to FIG. 3B, after the control gate 310 is formed, a dielectric layer 320 is formed to cover the control gate 310 and the buffer layer 302. The dielectric layer 320 is, for example, formed by CVD and the material thereof is, for example, silicon dioxide. Next, after the dielectric layer 320 is formed, an α-SiGe layer 330 is formed on the dielectric layer 320. The α-SiGe layer 330 is, for example, formed by CVD and the thickness thereof is a range of, for example, about 3-10 nm.

Figure 3C:
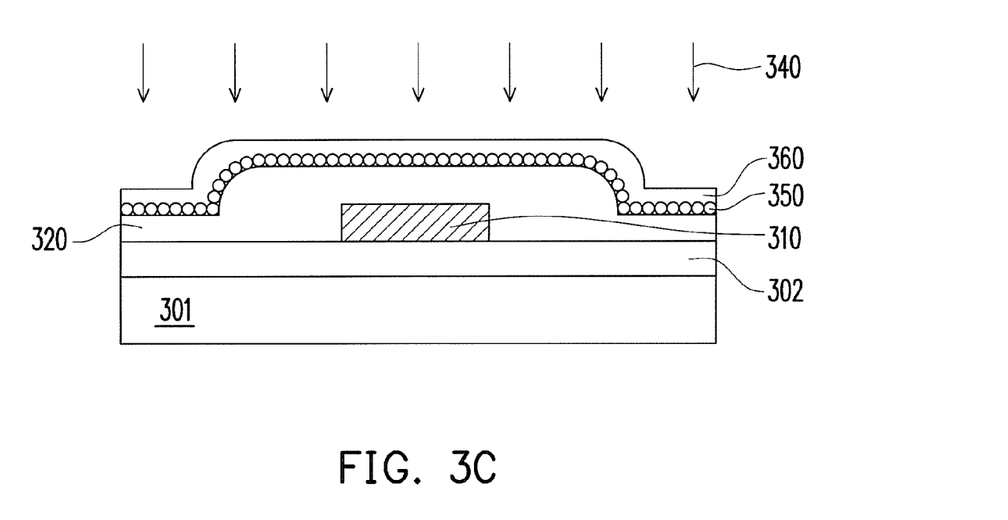

Afterward, referring to FIG. 3C, after the α-SiGe layer 330 is formed, a laser annealing process 340 is performed to oxidize the α-SiGe layer 330 into a silicon oxide layer 360, so as to separate out Ge atoms from the α-SiGe layer 330 to form a Ge quantum dot layer 350 between the silicon oxide layer 360 and the dielectric layer 320. The Ge quantum dot layer 350 can function as a trapping layer. In the present embodiment, the laser annealing process 340 is, for example, an ELA process. Particularly, the laser annealing process 340 is, for example, performed in an atmosphere containing oxygen, wherein oxygen atoms react with Si atoms of the α-SiGe layer 330, so as to separate out Ge atoms from the α-SiGe layer 330. The material of the silicon oxide layer 360 is, for example, silicon dioxide.

It should be noted that the above technique using the laser annealing process to separate out Ge atoms from the α-SiGe layer so as to form a Ge quantum dot layer serving as a trapping layer can be performed under the room temperature. The transient temperature of the laser annealing process can reach approximately 1000° C. When being transmitted to the buffer layer 302, the temperature is reduced to approximately below 100° C., so as to effectively reduce the thermal budget of the process.

In another aspect, in the present embodiment, the silicon oxide layer 360 formed after separating out Ge atoms from the α-SiGe layer 330 can be directly used as a charge tunneling layer, and thus it is unnecessary to form another dielectric layer. Moreover, the charge tunneling layer formed in this manner is very thin, thereby improving the reading speed of the whole device and reducing the operating voltage of the device.

Figure 3D:
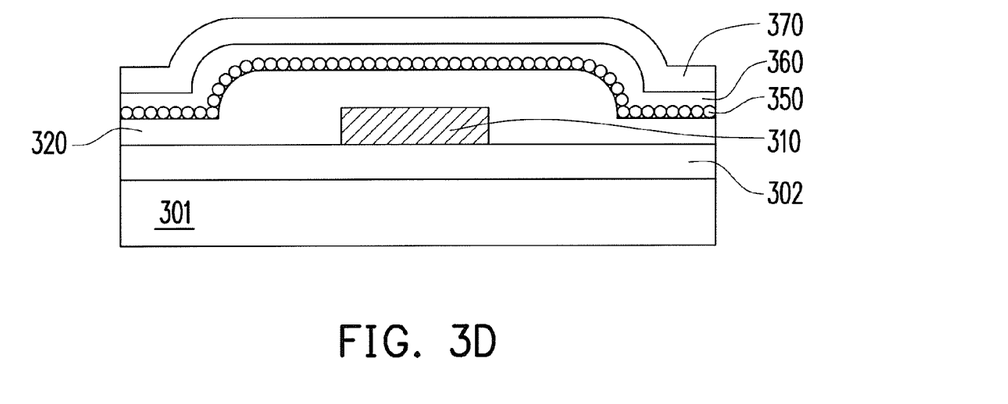

Then, referring to FIG. 3D, an amorphous silicon layer 370 is formed on the silicon oxide layer 360. The amorphous silicon layer 370 is formed by, for example, CVD.

Figure 3E:
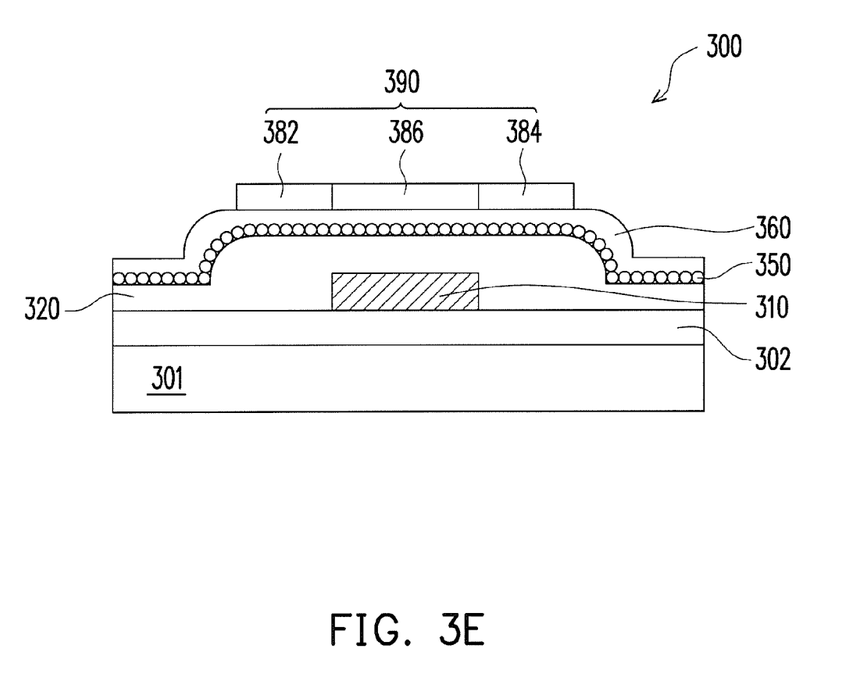

After that, referring to FIG. 3E, an annealing process is used to melt the amorphous silicon layer 370, and a polysilicon layer (not shown) is formed by recrystallization. In the present embodiment, the annealing process is, for example, an ELA process. The polysilicon layer, after being formed, is patterned and then doped to form a poly-Si island 390 having a source doped region 382, a drain doped region 384, and a channel region 386, so as to fabricate the memory cell 300 of the present embodiment.

Definitely, after forming the poly-Si island 390, a source contact metal (not shown), a drain contact metal (not shown), and a passivation layer (not shown) are successively formed, and the details thereof will not be described herein again.

Referring to FIG. 3E again, the memory cell 300 of the present invention is suitable to be disposed on a substrate 301, and the substrate 301 is, for example, a glass substrate or other transparent substrates. The memory cell 300 of the present embodiment includes a control gate 310, a dielectric layer 320, a Ge quantum dot layer 350, a silicon oxide layer 360, and a poly-Si island 390. The control gate 310 is disposed on the substrate 301. The dielectric layer 320 is disposed on the control gate 310, and located on the substrate 301. The Ge quantum dot layer 350 is disposed on the dielectric layer 320, serving as a trapping layer. The silicon oxide layer 360 is disposed on the Ge quantum dot layer 350. Furthermore, the poly-Si island 390 is disposed on the silicon oxide layer 360, wherein the poly-Si island 390 includes a source doped region 382, a drain doped region 384, and a channel region 386 located therebetween. The components of the memory cell 300 will be illustrated in detail as follows.

In the present embodiment, the source doped region 382 and the drain doped region 384 of the poly-Si island 390 are highly-doped N-type doped regions (N+), and the channel region 386 of the poly-Si island 390 is a low-doped N-type doped region (N−).

In the present embodiment, the silicon oxide layer 360 can be taken as a charge tunneling layer, and the material thereof is, for example, silicon dioxide. The Ge quantum dot layer 350 can function as a trapping layer which is regarded as a charge storage layer. Moreover, the dielectric layer 320 can be taken as a charge blocking layer, and the material thereof is, for example, silicon dioxide or other dielectric materials capable of resisting the injection of charges.

Furthermore, in an embodiment, the memory cell 300 of the present embodiment further includes a buffer layer 302 disposed between the substrate 301 and the control gate 310. The buffer layer 302 can prevent the impurities of the substrate 301 from dispersing, and the material thereof can be silicon nitride thin film or other thin films capable of blocking impurities.

Moreover, in order to enhance the device reliability of the memory cell 300, the memory cell 300 of the present embodiment further includes a passivation layer (not shown), and the material thereof is, for example, silicon oxide, silicon nitride, or the combination thereof. Definitely, in order to successfully apply a voltage to the source doped region 382 and the drain doped region 384, the memory cell 300 of the present embodiment can further include a source contact metal (not shown) and a drain contact metal (not shown).

It should be noted that the above control gate 310, dielectric layer 320, Ge quantum dot layer 350, silicon oxide layer 360, and poly-Si island 390 constitute a workable memory cell. The buffer layer 302, passivation layer, source contact metal, and drain contact metal are all optional components. Various appropriate modifications and variations can be made by those skilled in the art with reference to the content of the present invention, and the modifications and variations still fall in the scope of the present invention.

Then, the memory cell of the present invention is applied to the pixel structure and the operation thereof is illustrated below.

Figure 4:
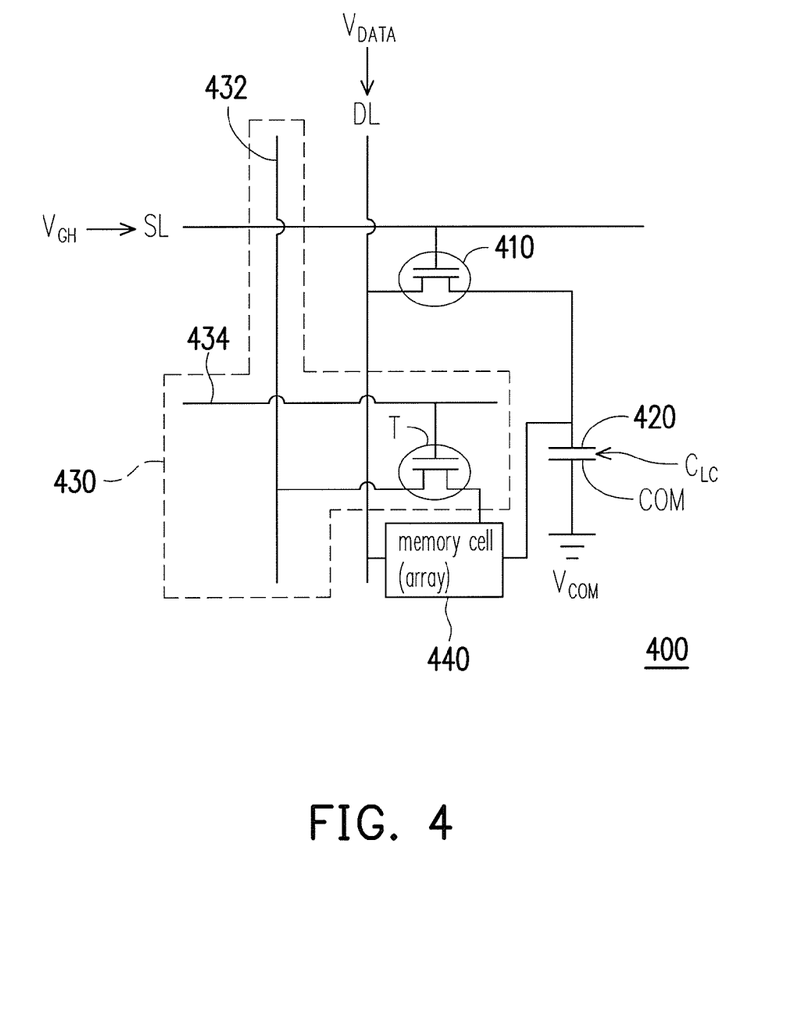
FIG. 4 is a circuit diagram of the pixel structure of the present invention.

FIG. 4 is a circuit diagram of the pixel structure of the present invention. Referring to FIG. 4, a pixel structure 400 of the present invention is suitable to be electrically connected to a scan line SL and a data line DL. The pixel structure 400 includes an active device 410, a pixel electrode 420, a control circuit 430, and a memory cell 440. The pixel electrode 420 is electrically connected to the scan line SL and the data line DL through the active device 410. The memory cell 440 is electrically connected between the control circuit 430 and the pixel electrode 420. The active device 410 is, for example, a TFT. The control circuit 430 is, for example, constituted by one or more thin film transistors T. The memory cell 440 is, for example, a single memory cell or a type of memory cell array.

Seen from FIG. 4, the pixel electrode 420 electrically connected to the active device 410 is usually disposed below a facing substrate (for example, a color filter), and a liquid crystal layer is filled between the pixel electrode 420 and a common electrode COM, such that the pixel electrode 420, the common electrode COM coupled to a voltage $V_{COM}$, and the liquid crystal layer disposed therebetween constitute a liquid crystal capacitor $C_{LC}$.

Referring to FIG. 4 again, in addition to the TFT T, the control circuit 430 further includes control lines 432 and 434, wherein the control line 434 is electrically connected to the gate of the TFT T, the control line 432 is electrically connected to the source of the TFT T, and the drain of the TFT T is electrically connected to the memory cell 440.

Seen from FIG. 4, when a high voltage $V_{GH}$ is applied to the scan line SL, the active device 410 assumes an ON state. At this time, an image data $V_{DATA}$ is written to the pixel electrode 420 via the data line DL and the active device 410. When the image data $V_{DATA}$ is written to the pixel electrode 420, the memory cell 440 is in a written state under control of the control line 432, control line 434 and TFT T, so the image data $V_{DATA}$ can also be stored in the memory cell 440 through the data line. In another aspect, when the pixel structure 400 is used to display static images, the voltage level of the pixel electrode 420 is maintained by the image data $V_{DATA}$ stored in the memory cell 440. In other words, the voltage level of the pixel electrode 420 can be the same as that of the image data $V_{DATA}$ under control of the control line 432, control line 434, and TFT T, so as to avoid the deterioration of the image quality. As such, the present invention does not need to update data frame by frame through the scan line SL and the data line DL.

In view of the above, the present invention has at least the following advantages.

1. The method of fabricating the memory cell of the present invention can adopt a low temperature process to form the Ge quantum dot layer serving as a trapping layer, thereby effectively reducing the thermal budget of the process.

2. The method of fabricating the memory cell of the present invention can form a thin charge tunneling layer, so that the reading speed of the overall device can be improved and the operating voltage of the device can be reduced.

3. The present invention can be integrated into the LTPS-LCD panel manufacturing process, so as to fabricate a pixel structure with an embedded memory cell.

4. The memory cell of the present invention can be applied to transmissive, reflective, and transflective LTPS-LCD panels and overcome the problem of low aperture ratio.

5. The present invention can greatly reduce the number of the TFT required in the pixel structure, thereby further improving the aperture ratio of the panel.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:
1. A method of fabricating a memory cell, comprising:
providing a substrate;
forming a control gate on the substrate;
forming a dielectric layer to cover the control gate and the substrate;
forming an α-SiGe layer on the dielectric layer;
performing a laser annealing process to oxidize the α-SiGe layer into a silicon oxide layer, so as to separate out Ge atoms from the α-SiGe layer to form a Ge quantum dot layer between the silicon oxide layer and the dielectric layer; and forming a poly-Si island on the silicon oxide layer, wherein the poly-Si island comprises a source doped region, a drain doped region, and a channel region located therebetween.

2. The method of fabricating the memory cell as claimed in claim 1, wherein the laser annealing process comprises an excimer laser annealing process.

3. The method of fabricating the memory cell as claimed in claim 1, wherein the laser annealing process is performed in an atmosphere containing oxygen.

4. The method of fabricating the memory cell as claimed in claim 1, wherein a material of the silicon oxide layer comprises silicon dioxide.

5. The method of fabricating the memory cell as claimed in claim 1, wherein the thickness of the α-SiGe layer is in a range of about 3-10 nm.

6. The method of fabricating the memory cell as claimed in claim 1, wherein the method of forming the poly-Si island comprises:

forming an amorphous silicon layer on the silicon oxide layer;

performing an annealing process to recrystallize the amorphous silicon layer into a polysilicon layer;

patterning the polysilicon layer; and doping the polysilicon layer to form the source doped region, the drain doped region, and the channel region.

7. The method of fabricating the memory cell as claimed in claim 6, wherein the annealing process comprises an ELA process.

8. The method of fabricating the memory cell as claimed in claim 1, further comprising forming a buffer layer between the substrate and the control gate.

9. The method of fabricating the memory cell as claimed in claim 1, wherein a material of the dielectric layer comprises silicon dioxide.

* * * * *